United States Patent
Malhotra et al.

(10) Patent No.: US 6,949,461 B2
(45) Date of Patent: Sep. 27, 2005

(54) METHOD FOR DEPOSITING A METAL LAYER ON A SEMICONDUCTOR INTERCONNECT STRUCTURE

(75) Inventors: Sandra G. Malhotra, Beacon, NY (US); Andrew Herbert Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/318,605

(22) Filed: Dec. 11, 2002

(65) Prior Publication Data

US 2004/0115928 A1 Jun. 17, 2004

(51) Int. Cl.$^7$ .......................................... H01L 21/4763
(52) U.S. Cl. ...................................... 438/643; 438/644
(58) Field of Search ................. 438/627, 628, 438/643, 644, 648, 656, 652–654, 629, 672, 696

(56) References Cited

U.S. PATENT DOCUMENTS

| | | | | |
|---|---|---|---|---|
| 5,326,427 A | * | 7/1994 | Jerbic | 438/727 |
| 5,366,929 A | * | 11/1994 | Cleeves et al. | 438/644 |
| 5,654,232 A | * | 8/1997 | Gardner | 438/661 |
| 5,679,213 A | * | 10/1997 | Noshiro | 438/669 |
| 5,933,753 A | * | 8/1999 | Simon et al. | 438/629 |
| 5,985,762 A | * | 11/1999 | Geffken et al. | 438/687 |
| 6,080,669 A | * | 6/2000 | Iacoponi et al. | 438/672 |
| 6,174,800 B1 | * | 1/2001 | Jang | 438/629 |
| 6,191,029 B1 | | 2/2001 | Hsiao et al. | |
| 6,200,890 B1 | | 3/2001 | Chen | |
| 6,214,731 B1 | | 4/2001 | Nogami et al. | |
| 6,284,657 B1 | * | 9/2001 | Chooi et al. | 438/687 |
| 6,498,091 B1 | * | 12/2002 | Chen et al. | 438/627 |
| 6,559,061 B2 | * | 5/2003 | Hashim et al. | 438/722 |
| 6,607,977 B1 | * | 8/2003 | Rozbicki et al. | 438/627 |

* cited by examiner

*Primary Examiner*—David A. Zarneke
(74) *Attorney, Agent, or Firm*—Ira D. Blecker

(57) ABSTRACT

Disclosed is a method for depositing a metal layer on an interconnect structure for a semiconductor wafer. In the method, a metal conductor is covered by a dielectric layer. The dielectric layer is patterned so as to expose the metal conductor. A liner layer is then deposited into the pattern. The liner layer is then argon sputter etched to remove the liner layer and expose the metal conductor. In the process of argon sputter etching, the liner layer is redeposited onto the sidewall of the pattern. Lastly, an additional layer is deposited into the pattern and covers the redeposited liner layer.

18 Claims, 2 Drawing Sheets

METHOD FOR DEPOSITING A METAL LAYER ON A SEMICONDUCTOR INTERCONNECT STRUCTURE

RELATED APPLICATION

This application is related to U.S. patent application Ser. No. 10/318,606, entitled "A Method for Depositing a Metal Layer on a Semiconductor Interconnect Structure Having a Capping Layer" (IBM Docket No. FIS9-2002-0182US1), filed even date herewith.

BACKGROUND OF THE INVENTION

The present invention relates to semiconductor processing and more particularly relates to the processing of semiconductor wafers incorporating advanced interconnect structures using copper metallurgy.

Advanced interconnect structures using copper metallurgy present a number of technical challenges with regard to functional performance. Foremost among these is achieving a low contact resistance that is stable under thermal cycling, as well as good reliability under electromigration and stress migration.

Electromigration is the movement of the ions in a conductor such as copper in response to the passage of current through it and can ultimately lead to an open-circuit failure of the conductor.

Various prior art approaches have been developed to prevent or limit electromigration, particularly in copper metal lines and interconnects. Thus, Hsiao et al. U.S. Pat. No. 6,191,029, the disclosure of which is incorporated by reference herein, discloses a method for fabricating a metal interconnect including depositing a barrier metal layer in a trench, depositing a conductive metal such as copper to fill the trench, etching away part of the copper to form a concavity in the trench, and filling the concavity with a top barrier layer and then dielectric material. The conformal top barrier layer over the copper improves electromigration resistance.

Chen U.S. Pat. No. 6,200,890, the disclosure of which is incorporated by reference herein, discloses a method for fabricating a metal interconnect including etching away part of the dielectric layer after copper wire formation so that the copper wires project from the surface of the dielectric layer, and then forming a top barrier layer over the projecting copper wires to prevent electromigration and current leakage.

Nogami et al. U.S. Pat. No. 6,214,731, the disclosure of which is incorporated by reference herein, discloses a process for fabricating a metal interconnect including depositing a barrier metal layer in a trench, treating the barrier metal layer with a silane to form a silicon layer, and depositing copper on the silicon layer to fill the trench, whereby the copper and silicon react to form a copper silicide layer between the barrier metal layer and the deposited copper. The copper silicide layer improves interface defect density and electromigration resistance.

Despite the existence of various prior art methods for addressing the known problems of electromigration, the prior art does not appear to appreciate the contribution made by conventionally-employed metal layer deposition steps to the problem of electromigration. The failure to realize these challenges has become particularly acute with the employment of organic dielectric films. Thus, the side wall and undercut profiles observed with interconnect structures such as trenches and vias in organic dielectrics present unprecedented difficulties in and of themselves in achieving high-integrity liner and seed layer coverage of such trenches and vias prior to metal filling. Another problem with the organic dielectric films is so-called time dependent dielectric breakdown (TDDB) in which copper, for example, penetrates incomplete side wall layers and poisons the dielectric material. Accordingly, the need continues to exist for methods for fabricating metal interconnects, and particularly copper interconnects, having improved electromigration resistance and reduced stress migration and which avoid TDDB.

Currently known metal barrier schemes include, among other things, argon sputter cleaning of the patterned dielectric. Conversely, all existing solutions to the problems of electromigration and TDDB known to the present inventors involve depositions of metal layers, or sequences of metal layers, without any contemplation of sputtering steps in between sequential metal layer depositions. In practice, deposition tool vendors specifically recommend against argon sputtering on metal layers, owing to concerns relating to shorting of the shielding, and also because the metallic material coats the dome of the sputter chamber, does not adhere well, and eventually flakes off onto subsequent wafers, causing yield loss due to excess foreign material.

BRIEF SUMMARY OF THE INVENTION

According to a first aspect of the present invention, there is provided a method for depositing a metal layer on an interconnect structure for a semiconductor wafer, the method comprising the steps of:

(a) providing an interconnect structure comprising a metallic conductor covered by a dielectric layer;

(b) patterning the dielectric layer to form an opening that exposes the metal conductor;

(c) depositing a liner layer on a wall and bottom of the opening;

(d) sputter-etching the liner layer to expose the metal conductor and at least partially redepositing the liner layer on a sidewall of the opening; and (e) depositing at least one additional layer on the wall of the opening and covering the redeposited liner layer.

According to a second aspect of the present invention, there is provided a method for depositing a metal layer on an interconnect structure for a semiconductor wafer, the method comprising the steps of:

(a) providing an interconnect structure comprising a metallic conductor covered by a capping layer and a dielectric layer;

(b) patterning the dielectric layer and capping layer to form an opening that exposes the metal conductor;

(c) depositing a liner layer on a wall and bottom of the opening;

(d) sputter-etching the liner layer to expose the metal conductor and at least partially redepositing the liner layer on a sidewall of the opening; and (e) depositing at least one additional layer on the wall of the opening and covering the redeposited liner layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
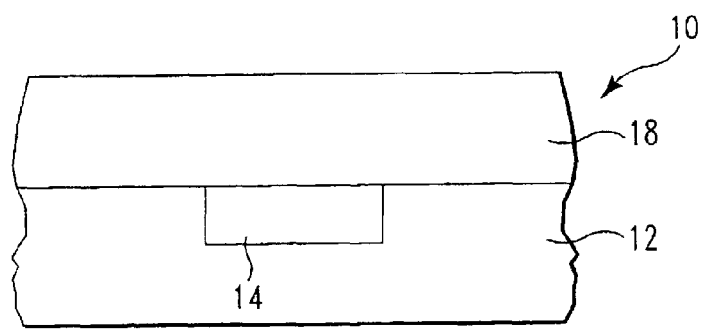
FIGS. 1A to 1D are cross-sectional side views of a semiconductor wafer illustrating a first embodiment of a process according to the present invention for depositing a metal layer.

Referring to the Figures in more detail, and particularly referring to FIGS. 1A to 1D, there is illustrated a first embodiment of a process according to the present invention. Referring first to FIG. 1A, two levels of semiconductor wafer 10 are shown. A first level includes interlevel dielectric (ILD) layer 12. For the sake of clarity, the underlying silicon is not shown. In the next level, ILD 18 is deposited on ILD 12 using conventional techniques.

Any dielectric material can be used for ILDs 12, 18. However, the demands of current sub-micron high-density integrated circuits require that ILDs 12, 18 preferably constitute organic dielectric layers, and more preferably a low-k organic dielectric layer, i.e., organic dielectric materials having a low dielectric constant generally defined as about 3.0 or less. One preferred example of such a low-k organic dielectric material is SiLK (a poly (arylene ether) available from Dow Chemical). The composition of ILDs 12, 18 is not limited to organic low-k dielectrics. Rather, they may be composed of any dielectric known to one skilled in the art to be useful as an ILD. The metal conductive line 14 may comprise copper, tungsten or aluminum. If the metal conductive line 14 is the first metal level, then tungsten is preferred while copper is preferred for subsequent levels.

Figure 1B:
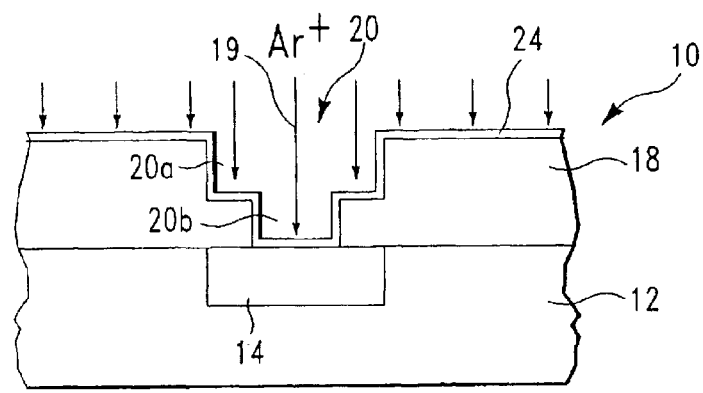

Referring now to FIG. 1B, a circuitry pattern 20 is then patterned on and through ILD 18, preferably using conventional lithographic and etch techniques (e.g., reactive ion etching (RIE)). The circuitry pattern includes, for example, an interconnect structure such as trench 20a and via 20b for forming a metal conductive interconnect to metal conductive line 14. The interconnect structure shown is a double damascene structure but this particular structure is not necessary to the present invention. The circuitry pattern can include any desired pattern of lines (trench structures), vias (interconnects) and other structures such as pads and devices such as FETs, conventionally designed into such semiconductor wafers, depending on the predetermined design requirements of the fabricated multi-level semiconductor integrated circuit. Very Large Scale Integration (VLSI) technology may include five or six (or possibly more) levels of patterns of integrated and interconnected circuitry elements having individual features of sub-micron dimension.

As also shown in FIG. 1B, a liner layer (or layers) 24 is deposited in the circuitry opening 20. Preferably a liner layer 24 of TaN, Ta, Ti, Ti(Si)N or W is conventionally deposited (e.g., by chemical vapor deposition (CVD), plasma vapor deposition (PVD) or other process.

Figure 1C:
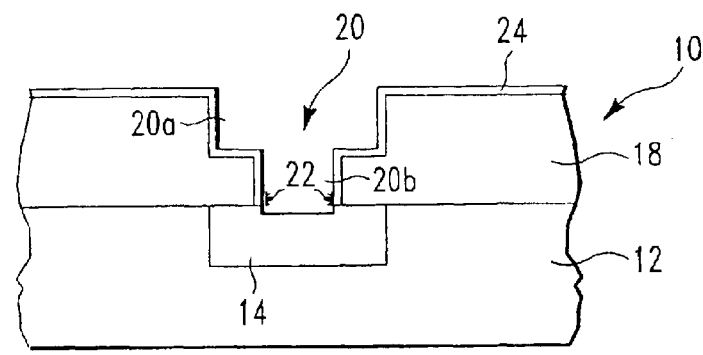

According to the present invention, a sputter etch (exemplified as an argon sputter etch as shown in FIG. 1B) is utilized to remove the liner layer 24 over the metal conductive line 14. While argon is shown for purposes of illustration and not limitation, any pure gas such as Ar, He, Ne, Xe, N$_2$, H$_2$, NH$_3$, N$_2$H$_2$, or mixtures thereof, can be used for the sputter etch process. If desired, the metal conductive line 14 may also be sputter etched so as to etch back the metal conductive line 14 as shown in FIG. 1C. Etching back the metal conductive line is an optional step. The present inventors have found that when the liner layer 24 is argon sputter etched, part of the liner layer 24 is redeposited 22 onto the sidewall of the circuitry pattern 20, more particularly via 20b, as shown in FIG. 1C. Such redeposition provides some extra material (particularly useful as extra Cu diffusion barrier material when Cu is the via/trench metal) near the bottom of the circuitry pattern 20, particularly via 20b, and alleviates electromigration and TDDB problems that may arise later.

The horizontal portions of liner layer 24 on the top of ILD 18 and in trench 20a are usually much thicker than the horizontal portion of liner layer 24 at the bottom of via 20b as a normal consequence of the deposition process. Accordingly, after sputter etching, the horizontal portions of liner layer 24 on the top of ILD 18 and in trench 20a may partially remain, although thinned somewhat, or may be etched away completely. FIG. 1C shows such horizontal portions of liner layer 24 partially remaining.

Sputter etching is a process whereby a wafer is held between two electrically biased electrodes in a vaccum chamber and then a suitable gas is fed into the vacuum chamber to create a plasma which bombards the surface of the wafer. The ionized gas particles cause etching of the surface of the wafer. Using Ar gas during the sputter etching, the present inventors have found that the preferred operation conditions of the argon sputter etching are as follows: gas flow of 20 sccm argon, temperature of 20° C., bias of top electrode of 400 KHz and 750 W, table bias of 13.56 MHz and 400W, and a process pressure of approximately 0.6 mtorr. These operation conditions are approximate and, as can be appreciated by one skilled in the art, will vary depending on the manufacturer of the sputter etch chamber.

Figure 1D:
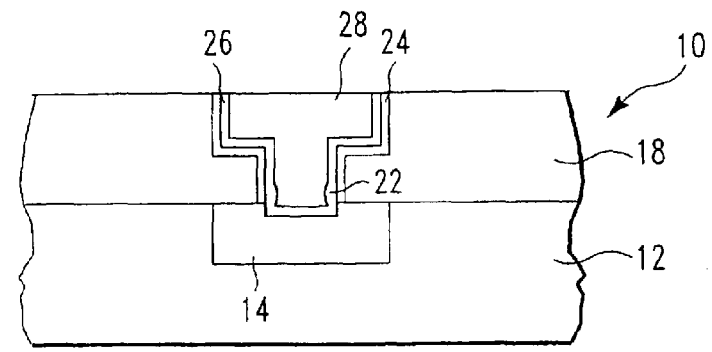

Referring now to FIG. 1D, after the wafer is removed from the sputter etch chamber and placed back in a deposition chamber, an additional layer (or layers) 26 may be deposited in the circuitry opening 20. Preferably, additional layer 26 of TaN, Ta, Ti, Ti(Si)N, W or Cu is conventionally deposited (e.g., by chemical vapor deposition (CVD), plasma vapor deposition (PVD) or other process). If copper is to be the material for the metal conductive line 14, then a copper seed layer (not shown) may be deposited on top of the additional layer 26. In a preferred embodiment, liner layer 24 is TaN, additional layer 26 is Ta followed by the copper seed layer.

The deposition of additional layer 26 may be preceded by an optional airbreak sequence in which the semiconductor wafer 10 is exposed to atmosphere or partial pressure of atmosphere. Moreover, the airbreak sequence may be done either prior to or after the sputter etching. This is in contrast to a conventional clustered process wherein the wafer may be moved between deposition tools in vacuum without ever being exposed to the atmosphere. Such an airbreak may be desirable to increase adhesion between the liner layer 24 and additional layer 26.

Fill metallurgy 28 is then conventionally deposited followed by a planarization process such as chemical-mechanical polishing or the like to result in the structure shown in FIG. 1D. If the fill metallurgy 28 is copper, the wafer is removed from the deposition chamber and copper fill metallurgy 28 is plated conventionally. If the fill metallurgy 28 is W or Al, the W or Al could be deposited in the same deposition chamber or, more in keeping with conventional practice, would be moved to a chamber specially set up to handle the W or Al fill metallurgy 28.

Figure 2A:
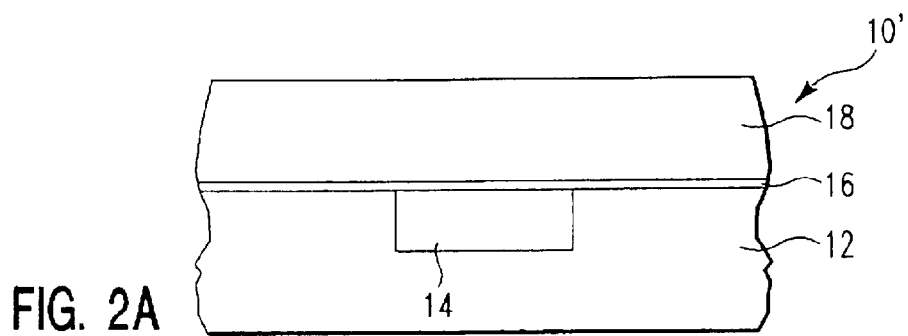
FIGS. 2A to 2D are cross-sectional side views of a semiconductor wafer illustrating a second embodiment of a process according to the present invention for depositing a metal layer.

Referring now to FIGS. 2A to 2D, a second embodiment of a process according to the present invention is described. FIG. 2A is identical to FIG. 1A previously described including the materials that may be used for the various layers except that there is now a capping layer 16 between ILD 12 and ILD 18. Capping layer 16 protects the metal conductive line 14 from oxidation, humidity and contamination during processing of the next level of semiconductor wafer 10. Additionally, capping layer 16 serves to prevent undesirable diffusion of conductive line 14 into ILD 18. Capping layer 16 can be made of any suitable capping material such as silicon nitride, silicon carbide, silicon oxycarbide, hydrogenated silicon carbide, silicon dioxide, organosilicate glass, and other low-k dielectrics.

Figure 2B:
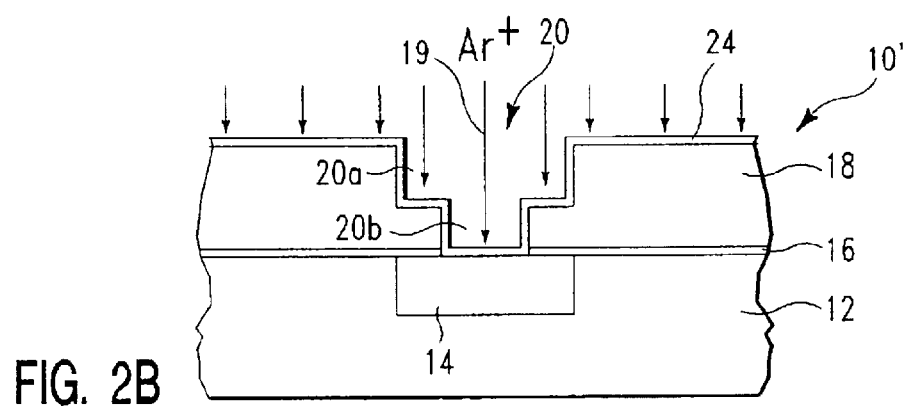

Capping layer 16 as shown in FIG. 2B covers ILD 12 as well as conductive line 14. Capping layer 16, however, may also consist of a selective metallic cap (for example, CoWP, Ta or W) which only covers metallic line 14 and does not cover ILD 12.

Referring now to FIG. 2B, a circuitry pattern 20 is then patterned on and through ILD 18 and capping layer 16, preferably using conventional lithographic and etch techniques as described with respect to FIG. 1B to form trench 20a and via 20b. The circuitry pattern 20 has now exposed metal conductive line 14.

Figure 2C:
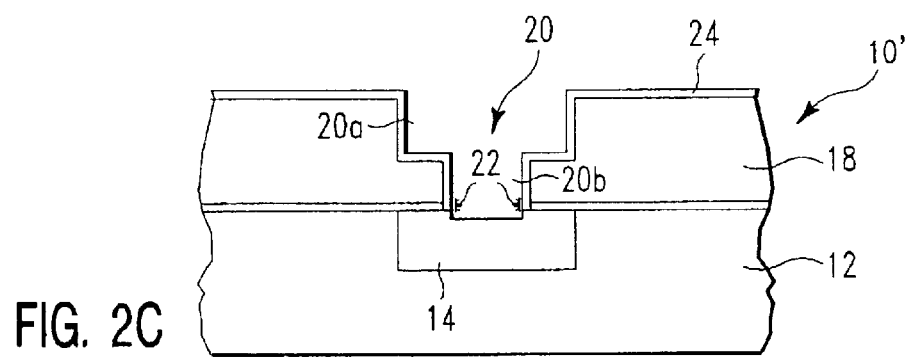

Referring still to FIG. 2C, a liner layer 24 of TaN, Ta, Ti, Ti(Si)N, or W is conventionally deposited. The semiconductor wafer 10' is now subjected to sputter etching, again using one of the gases (or a mixture thereof) previously discussed. Argon sputter etching is illustrated for purposes of illustration and not limitation. The operating parameters are similar to those discussed earlier. In this embodiment of the present invention, liner layer 24 is sputter etched to result in the structure shown in FIG. 2C. Again, if desired, sputter etching may be continued past the liner layer 24 so as to etch back the metal conductive line 14. The liner layer 24 is redeposited 22 onto the sidewall of the via 20b.

Again, the horizontal portions of liner layer 24 on the top of ILD 18 and in trench 20a are usually much thicker than the horizontal portion of liner layer 24 at the bottom of via 20b as a normal consequence of the deposition process. Accordingly, after sputter etching, the horizontal portions of liner layer 24 on the top of ILD 18 and in trench 20a may partially remain, although thinned somewhat, or may be etched away completely. FIG. 2C shows such horizontal portions of liner layer 24 partially remaining.

Figure 2D:
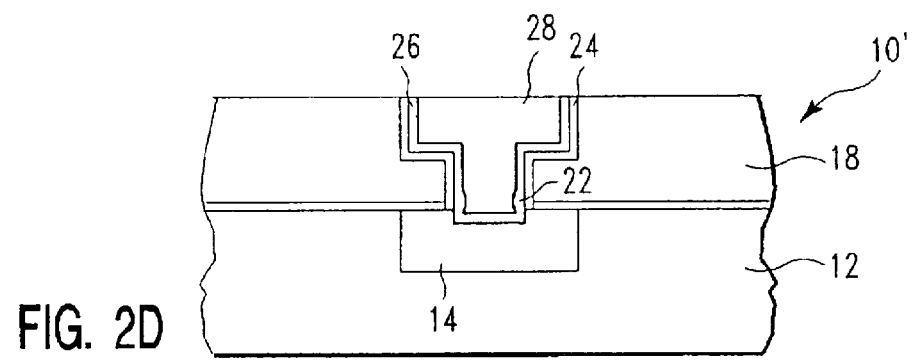

Thereafter, as shown in FIG. 2D, an additional layer 26 of TaN, Ta, Ti, Ti(Si)N, W or Cu is conventionally deposited. The wafer is then removed from the deposition chamber followed by deposition of fill metallurgy 28, preferably plated copper but W or Al may also be acceptable. If copper is used as the fill metallurgy 28, there will usually be deposited a prior copper seed layer. The semiconductor wafer 10' is then planarized by chemical-mechanical polishing or other similar process to result in the structure shown in FIG. 2D.

Again, the deposition of additional layer 26 may be preceded by an optional airbreak sequence in which the wafer 10 is exposed to atmosphere or partial pressure of atmosphere. Again, this may occur either prior to or after the step of sputter etching.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for depositing a metal layer on an interconnect structure for a semiconductor wafer, the method comprising the steps of:

(a) providing an interconnect structure comprising a metallic conductor covered by a dielectric layer;

(b) patterning the dielectric layer to form an opening that exposes the metal conductor;

(c) depositing a liner layer on a wall and bottom of the opening;

(d) sputter-etching the liner layer to expose the metal conductor and at least partially redepositing the sputter-etched liner layer on the liner layer on the wall of the opening;

(e) depositing at least one additional layer on the liner layer on the wall and the bottom of the opening and covering the redeposited liner layer;

(f) depositing a copper seed layer on the at least one additional layer; and (g) filling the opening with copper.

2. The method of claim 1 wherein the liner layer is selected from the group consisting of TaN, Ta, Ti, Ti(Si)N, and W.

3. The method of claim 1 wherein the opening is a via or a trench.

4. The method of claim 1 wherein the metal conductor is selected from the group consisting of copper, tungsten and aluminum.

5. The method of claim 1 wherein the gas for sputter etching is selected from the group consisting of Ar, He, Ne, Xe, N2, H2, NH3, N2H2 and mixtures thereof.

6. The method of claim 1 wherein in the step of sputter etching, the sputter etching stops on a top surface of the metal conductor.

7. The method of claim 1 wherein in the step of sputter etching, the sputter etching stops after at least partially sputter etching the metal conductor.

8. The method of claim 1 wherein between the steps of depositing a liner layer and depositing at least one additional layer, the wafer is exposed to an airbreak.

9. A method for depositing a metal layer on an interconnect structure for a semiconductor wafer, the method comprising the steps of:

(a) providing an interconnect structure comprising a metallic conductor covered by a capping layer and a dielectric layer;

(b) patterning the dielectric layer and capping layer to form an opening that exposes the metal conductor;

(C) depositing a liner layer on a wall and bottom of the opening;

(d) sputter-etching the liner layer to expose the metal conductor and at least partially redepositing the sputter-etched liner layer on the liner layer on the wall of the opening;

(e) depositing at least one additional layer on the liner layer on the wall and the bottom of the opening and covering the redeposited liner layer;

(f) depositing a copper seed layer on the at least one additional layer; and (g) filling the opening with copper.

10. The method of claim 9 wherein the capping layer is selected from the group consisting of silicon nitride, silicon carbide, silicon oxycarbide, hydrogenated silicon carbide, silicon dioxide, organosilicare glass, and other low-k dielectric materials.

11. The method of claim 9 wherein the capping layer is thinner in thickness than the dielectric layer.

12. The method of claim 9 wherein the liner layer is selected from the group consisting of TaN, Ta, Ti, Ti(Si)N, and W.

13. The method of claim 9 wherein the opening is a via or a trench.

14. The method of claim 9 wherein the metal conductor is selected from the group consisting of copper, tungsten and aluminum.

15. The method of claim 9 wherein the gas for sputter etching is selected from the group consisting of Ar, He, Ne, Xe, $N_2$, $H_2$, $NH_3$, $N_2H_2$ and mixtures thereof.

16. The method of claim 9 wherein in the step of sputter etching, the sputter etching stops on a top surface of the metal conductor.

17. The method of claim 9 wherein in the step of sputter etching, the sputter etching stops after at least partially sputter etching the metal conductor.

18. The method of claim 9 wherein between the steps of depositing a liner layer and depositing at least one additional layer, the wafer is exposed to an airbreak.

* * * * *